(12) United States Patent
Liu et al.

(10) Patent No.: US 7,932,791 B2
(45) Date of Patent: Apr. 26, 2011

(54) SIGNAL MODULATION DEVICE AND SIGNAL AMPLIFIER COOPERATIVE THEREWITH

(75) Inventors: Chi-En Liu, Taipei (TW); Jean-Fu Kiang, Taipei (TW)

(73) Assignee: National Taiwan University, Taipei (TW)

( * ) Notice: Subject to any disclaimer, the term of this patent is extended or adjusted under 35 U.S.C. 154(b) by 201 days.

(21) Appl. No.: 12/346,222

(22) Filed: Dec. 30, 2008

(65) Prior Publication Data

US 2009/0267690 A1 Oct. 29, 2009

(30) Foreign Application Priority Data

Apr. 25, 2008 (TW) ................................ 97115201 A

(51) Int. Cl.
*H03C 1/00* (2006.01)
(52) U.S. Cl. ............................ 332/149; 330/10; 332/185
(58) Field of Classification Search .................. 332/149, 332/185; 330/10
See application file for complete search history.

(56) References Cited

U.S. PATENT DOCUMENTS

| | | | | |
|---|---|---|---|---|
| 6,300,845 B1 * | 10/2001 | Zou | .............. | 332/178 |
| 7,107,025 B2 * | 9/2006 | Khorram | .............. | 455/118 |
| 7,521,981 B2 * | 4/2009 | Ng et al. | .............. | 327/355 |
| 7,542,739 B2 * | 6/2009 | Borremans | .............. | 455/118 |
| 7,548,591 B2 * | 6/2009 | Parsa et al. | .............. | 375/298 |
| 7,750,749 B2 * | 7/2010 | Jones | .............. | 332/105 |
| 7,816,816 B2 * | 10/2010 | Tanaka | .............. | 307/131 |

OTHER PUBLICATIONS

Chi-En Liu; Design of Reader Transmitter and Tag Baseband Circuit for Radio-Frequency Identification; Master Thesis—National Taiwan University; Dec. 2007; 32 pages.

* cited by examiner

*Primary Examiner* — Patricia Nguyen
(74) *Attorney, Agent, or Firm* — Peter F. Corless; Steven M. Jensen; Edwards Angell Palmer & Dodge LLP

(57) ABSTRACT

A signal modulation device and a signal amplifier cooperative therewith. The signal modulation device includes a local oscillation signal source, a baseband signal source, a first NMOS transistor, and a second NMOS transistor, wherein the first and second NMOS transistors are coupled with the baseband signal source and form a circuit architecture of a Gilbert-cell based differential pair to be directly switched by a differential baseband signal, and a high-frequency signal from the local oscillation signal source is controlled by the baseband signal so as to generate an amplitude-modulation high-frequency signal at an output end. The single-stage signal power amplifier amplifies the amplitude-modulation signal from the preceding circuit so as to increase the magnitude of signals transmitted and simplify the preceding digital/analog signal conversion circuit in a conventional amplitude-modulation circuit.

15 Claims, 3 Drawing Sheets

SIGNAL MODULATION DEVICE AND SIGNAL AMPLIFIER COOPERATIVE THEREWITH

BACKGROUND OF THE INVENTION

1. Field of the Invention

The present invention relates to signal modulation devices and signal amplifiers cooperative therewith, and more particularly, to a signal modulation device and a signal amplifier cooperative therewith for use in a wireless RFID tag reader.

2. Description of Related Art

Radio-frequency identification (RFID) system relates to an automatic identification technology that involves affixing a small electronic tag to a product which is to be checked and monitored by a device known as "reader" which in turn transmits the data stored in the electronic tag back to the system via a wireless RF means, thus achieving remote authentication, tracking, control, management and handling.

The electronic tags come in two general varieties, passive or active. In particular, passive RFID tags have no internal power supply. The minute electrical current induced in the antenna by the incoming radio-frequency (RF) signal provides just enough power for the CMOS integrated circuit in the tag to power up and transmit a response.

The amplitude shift keying (ASK) modulation is a form of modulation that represents digital data as variations in the amplitude of a carrier wave, which is adopted to modulate the above-mentioned RF signal. Hence, signal modulation circuit is often designed on RFID tag reader to convert the information to be transmitted to ASK signal, which is in turn transmitted to the RFID tag.

Referring to FIG. 1, a schematic of the ASK modulation circuit is illustrated, the modulation circuit includes a D/A converter, a frequency synthesizer, bandpass filters, mixers and a power amplifier.

However, due to characteristics of ASK modulation signal, an ASK modulation circuit design does not require a D/A converter to generate a precise ASK signal. Moreover, adding a D/A converter to the baseband I/O terminals will significantly increase the overall power consumption of the RF circuit as well as the chip area.

In summary, it has become an urgent issue to designers of the RF circuit design field to propose a circuit that decreases the design complexity of the conventional ASK modulation circuit having a D/A converter, so as to significantly reduce the overall power consumption of the RF circuit as well as the chip area.

SUMMARY OF THE INVENTION

In view of the disadvantages of conventional technique, a primary objective of the present invention is to provide a signal modulation device to reduce the design complexity of conventional ASK modulation circuit which includes a D/A converter, so as to reduce the overall power consumption of the RF circuit and the chip area significantly. Another objective of the present invention is to provide a signal amplifier to increase the efficiency of signal transmission.

In order to achieve the above and other objectives, the present invention provides a signal modulation device including a local oscillation signal source; a baseband signal source; a first NMOS transistor; a second NMOS transistor; a first NPN transistor having a base, an emitter and a collector; a second NPN transistor having a base, an emitter and a collector; and a third NPN transistor having a base, an emitter and a collector.

The source of the first NMOS transistor is connected to the source of the second NMOS transistor to form a first connection node, and the baseband signal source is connected in series between the gate of the first NMOS transistor and the gate of the second NMOS transistor. The base of the first NPN transistor is connected to the local oscillation signal source and the collector of the first NPN transistor is connected to the first connection node. The drain of the second NMOS transistor is connected to a signal amplifier. A signal output terminal then outputs the modulation signal.

Also, the signal modulation device of the present invention further includes a first resistor having a first resistor terminal and a second resistor terminal, a second resistor having a third resistor terminal and a fourth resistor terminal, a third resistor having a fifth resistor terminal and a sixth resistor terminal, a fourth resistor having a seventh resistor terminal and an eighth resistor terminal, a first inductor having a first inductor terminal and a second inductor terminal, and a second inductor having a third inductor terminal and a fourth inductor terminal.

In particular, the first resistor terminal is connected to a drain of the first NMOS transistor, the third resistor terminal is connected to a drain of the second NMOS transistor, the fifth resistor terminal is connected to the collector of the second NPN transistor, and the seventh resistor terminal is connected to the drain of the first NMOS transistor.

In addition, the first inductor terminal is connected to the base of the first NPN transistor, the second inductor terminal is connected to the collector of the second NPN transistor and the base of the second NPN transistor, the third inductor terminal is connected to the collector of the first NPN transistor, the fourth inductor terminal is connected to the base of the third NPN transistor and the collector of the third NPN transistor.

Finally, the signal modulation device of the present invention further includes a power source and a ground terminal. Also, the second resistor terminal, the fourth resistor terminal, and the sixth resistor terminal are connected to the power source. In addition, the local oscillation signal source, the emitter of the first NPN transistor, the emitter of the second NPN transistor, the emitter of the third NPN transistor, and the eighth resistor terminal are connected to the ground terminal.

It is noted that in order to provide the first NMOS transistor and the second NMOS transistor with an appropriate operating bias voltage, the signal modulation device of the present invention includes a first bias voltage unit and a second bias voltage unit, wherein the first bias voltage unit is connected to the gate of the first NMOS transistor so as to provide the first NMOS transistor with an appropriate bias voltage. Also, the second bias voltage unit is connected to the gate of the second NMOS transistor, thereby providing the second NMOS transistor with an appropriate bias voltage.

In addition, the first bias voltage unit further includes a first biased NPN transistor, a second biased NPN transistor, a third biased NPN transistor and a fifth resistor having a ninth resistor terminal and a tenth resistor terminal.

In particular, the collector and the base of the first biased NPN transistor are connected to the gate of the first NMOS transistor, the collector and the base of the second biased NPN transistor are connected to the emitter of the first biased NPN transistor, the collector and the base of the third biased NPN transistor are connected to the emitter of the second biased NPN transistor, the emitter of the third biased NPN transistor is connected to the ground terminal, the ninth resistor terminal is connected to the collector of the first biased NPN transistor, and the tenth resistor terminal is connected to the power source.

Also, the second bias unit further includes a fourth biased NPN transistor, a fifth biased NPN transistor, a sixth biased NPN transistor and a sixth resistor having an eleventh resistor terminal and a twelfth resistor terminal.

In particular, the collector and the base of the fourth biased NPN transistor are connected to the gate of the second NMOS transistor. The collector and the base of the fifth biased NPN transistor are connected to the emitter of the fourth biased NPN transistor. The collector and the base of the sixth biased NPN transistor are connected to the emitter of the fifth biased NPN transistor, the emitter of the sixth biased NPN transistor is connected to the ground terminal, the eleventh resistor terminal is connected to the collector of the fourth biased NPN transistor, and the twelfth resistor terminal is connected to the power source.

Moreover, the signal modulation device of the present invention further includes a first capacitor, a second capacitor, a third capacitor, a fourth capacitor and a fifth capacitor.

In particular, the first capacitor is connected in series between the gate of the first NMOS transistor and the baseband signal source. The second capacitor is connected in series between the gate of the second NMOS transistor and the baseband signal source. The third capacitor is connected in series between the local oscillation signal source and the base of the first NPN transistor. The fourth capacitor is connected in series between the seventh resistor terminal and the drain of the first NMOS transistor and the fifth capacitor is connected in series between the signal amplifier and the drain of the second NMOS transistor.

Based on the above configuration, the present invention discloses a signal modulation device requiring a circuit structure that directly switches between the Gilbert-cell based differential pair using a differential baseband signal formed by the first NMOS transistor and the second NMOS transistor. The baseband signal is used to switch between the ON and OFF states of the first NMOS transistor and the second NMOS transistor, thereby switching the transmission routes of the local oscillation signal and forming an ASK modulated high-frequency signal at the signal output terminal.

In order to achieve the aforementioned objective and other objectives, the present invention further provides a signal amplifier wherein the signal amplifier includes: an NPN transistor having a base, a collector and an emitter, a front-end impedance matching network, a back-end impedance matching network, and a first pn-diode and a second pn-diode each having an n-terminal and a p-terminal.

In particular, the base of the NPN transistor is connected to the front-end impedance matching network, the collector of the NPN transistor is connected to the back-end impedance matching network, the n-terminal of the first pn-diode is connected to the p-terminal of the second pn-diode, the p-terminal of the first pn-diode is connected to the collector of the NPN transistor, and the n-terminal of the second pn-diode is connected to the base of the NPN transistor.

Also, the front-end impedance matching network further comprises a signal input terminal. The back-end impedance matching network further comprises a signal output terminal. The front-end impedance matching network further includes a first transmission line, a second transmission line, and a front-end Snatching capacitor. The back-end impedance matching network further includes a third transmission line, a fourth transmission line and a back-end Snatching capacitor.

In particular, one end of the signal input terminal is formed by a connection of one end of the first transmission line and one end of the second transmission line. The front-end matching capacitor is connected in series between the other end of the first transmission line and the base of the NPN transistor, and the other end of the signal input terminal is connected to a fifth capacitor. Also, one end of the signal output terminal is formed by a connection of one end of the third transmission line and one end of the fourth transmission line. Furthermore, an antenna unit is connected to the signal output terminal to transmit wireless RF signal. In addition, the back-end matching capacitor is connected in series between the other end of the third transmission line and the collector of the NPN transistor.

Also, the signal amplifier further includes a power source and a ground terminal. The power source is connected to the p-terminal of the first pn-diode. The emitter of the NPN transistor, the other end of the second transmission line, and the other end of the fourth transmission line are all connected to the ground terminal.

Finally, the signal amplifier disclosed by the present invention further includes a first resistor and a second resistor. The first resistor is connected in series between the back-end matching capacitor and the third transmission line. One end of the second resistor is connected between the first resistor and the third transmission line, and the other end of the second resistor is connected to the ground terminal.

Based on the above arrangement, it has been known that the signal amplifier as disclosed by the present invention receives the signal on the signal input terminal. Next, the signal is transmitted to the NPN transistor for signal power amplification via the front-end impedance matching network. Lastly the signal is transmitted to the signal output terminal via the back-end impedance matching network. The first resistor and the second resistor are connected such that the NPN transistor amplifier operates in an unconditionally stable region in order to amplify the ASK modulated signal transmitted from the front-end circuit, thereby increasing the efficiency of signal transmission by the antenna.

In summary, the signal modulation device and the signal amplifier as disclosed by the present invention reduces the design complexity of conventional ASK modulation circuit that contains a D/A converter. The overall power consumption of the RF circuit as well as the chip area are significantly reduced. Moreover, the efficiency of signal transmission by the antenna is also increased.

DETAILED DESCRIPTION OF PREFERRED EMBODIMENTS

The following illustrative embodiments are provided to illustrate the disclosure of the present invention, these and other advantages and effects can be apparently understood by those in the art after reading the disclosure of this specification.

The present invention can also be performed or applied by other different embodiments. The details of the specification may be on the basis of different points and applications, and numerous modifications and variations can be devised without departing from the spirit of the present invention. The following embodiments further illustrate the points of the present invention in detail, however the scope of the invention is not limited to any points.

Figure 1:
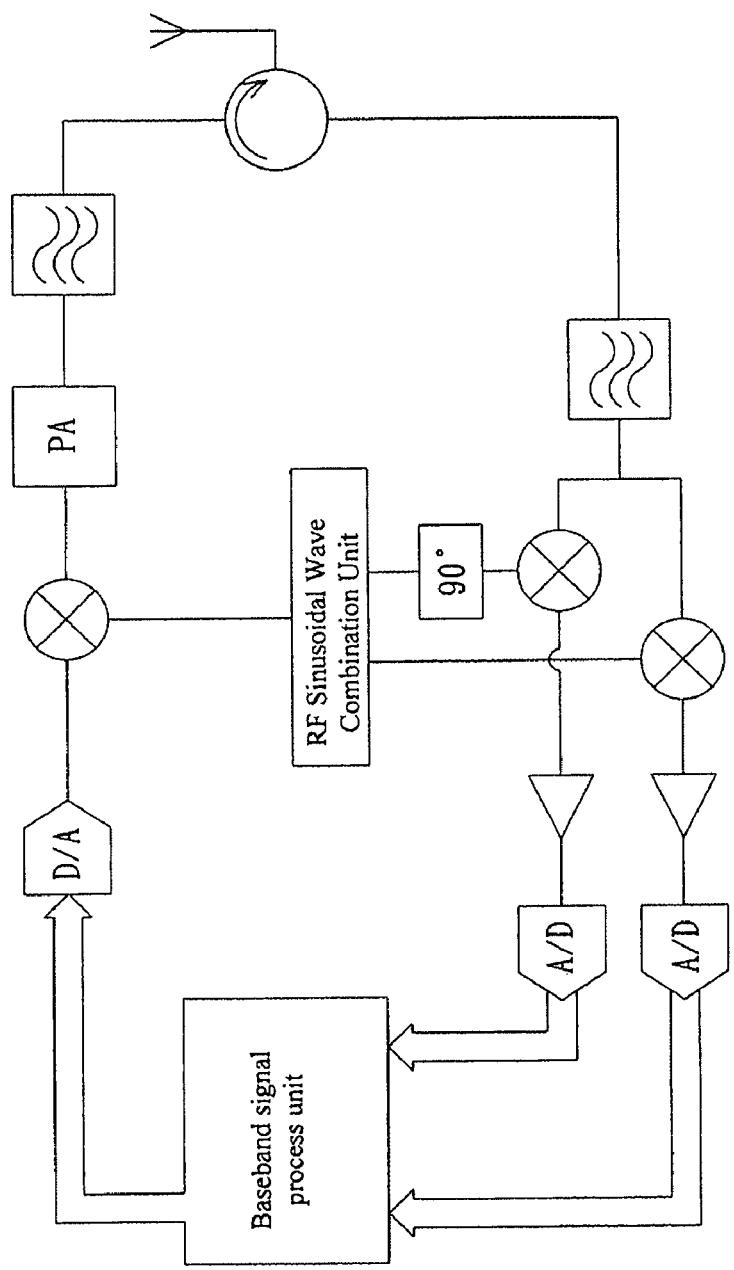
FIG. 1 is a block diagram showing an ASK modulation process.
Figure 2:
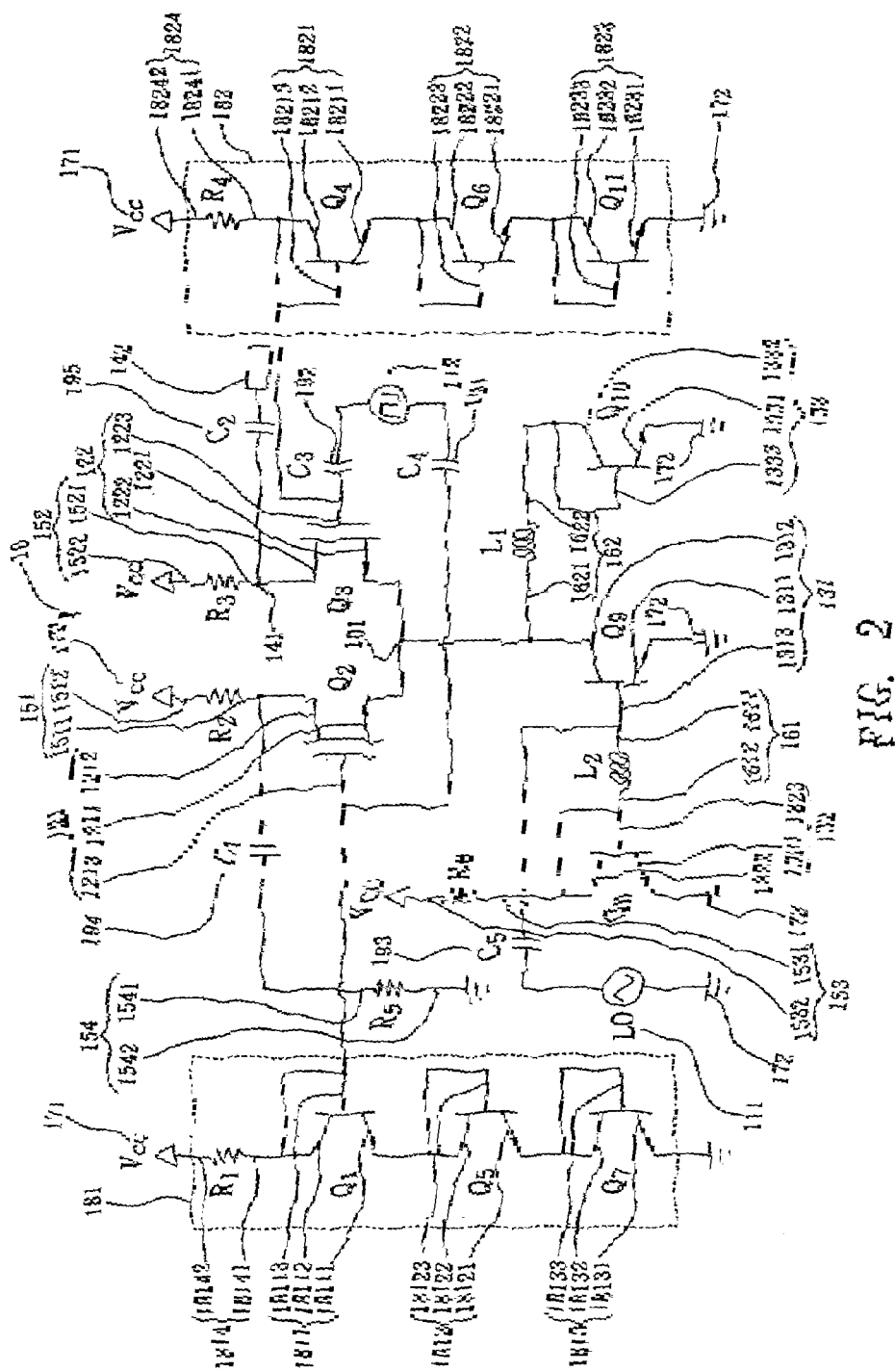
FIG. 2 illustrates a circuit schematic of a signal modulation device of the present invention.

FIG. 2 illustrates a circuit schematic of a signal modulation device of the present invention. As shown in the diagram, the present invention provides a signal modulation device 10 including a local oscillation signal source 111, a baseband signal source 112, a first NMOS transistor 121, a second NMOS transistor 122, a first NPN transistor 131, a second NPN transistor 132, and a third NPN transistor 133.

In particular, the first NMOS transistor 121 has a source 1211, a drain 1212, and a gate 1213. The second NMOS transistor 122 has a source 1221, a drain 1222, and a gate 1223. The first NPN transistor 131 has an emitter 1311, a collector 1312, and a base 1313. The second NPN transistor 132 has an emitter 1321, a collector 1322, and a base 1323. The third NPN transistor 133 has an emitter 1331, a collector 1332 and a base 1333.

Also the source 1211 of the first NMOS transistor 121 is connected to the source 1221 of the second NMOS transistor 122 to form a first connection node 101, and the baseband signal source 112 is connected in series between the gate 1213 of the first NMOS transistor 121 and the gate 1223 of the second NMOS transistor 122. The base 1313 of the first NPN transistor 131 is connected to a local oscillation signal source 111 and the collector 1312 of the first NPN transistor 131 is connected to the first connection node 101. The drain 1222 of the second NMOS transistor 122 is connected to a signal output terminal 141, which is then in turn connected to a back-end circuit 142 for outputting the modulation signal.

Besides, the signal modulation device of the present invention further includes a first resistor 151 having a first resistor terminal 1511 and a second resistor terminal 1512, a second resistor 152 having a third resistor terminal 1521 and a fourth resistor terminal 1522, a third resistor 153 having a fifth resistor terminal 1531 and a sixth resistor terminal 1532, a fourth resistor 154 having a seventh resistor terminal 1541 and an eighth resistor terminal 1542, a first inductor 161 having a first inductor terminal 1611 and a second inductor terminal 1612, and a second inductor 162 having a third inductor terminal 1621 and a fourth inductor terminal 1622.

In particular, the first resistor terminal 1511 is connected to the drain 1212 of the first NMOS transistor 121. The third resistor terminal 1521 is connected to the drain 1222 of the second NMOS transistor 122. The fifth resistor terminal 1531 is connected to the collector 1322 of the second NPN transistor 132. The seventh resistor terminal 1541 is connected to the drain 1212 of the first NMOS transistor 121.

The first inductor terminal 1611 is connected to the base 1313 of the first NPN transistor 131. The second inductor terminal 1612 is connected to the collector 1322 of the second NPN transistor 132 and the base 1323 of the second NPN transistor 132. The third inductor terminal 1621 is connected to the collector 1312 of the first NPN transistor 131. The fourth inductor terminal 1622 is connected to the collector 1332 of the third NPN transistor 133 and the base 1333 of the third NPN transistor 133.

Finally, the signal modulation device of the present invention further includes a power source 171 and a ground terminal 172. In addition, the second resistor terminal 1512, the fourth resistor terminal 1522 and the sixth resistor terminal 1532 are connected to the power source 171. Also the local oscillation signal source 111, the emitter 1311 of the first NPN transistor 131, the emitter 1321 of the second NPN transistor 132, the emitter 1331 of the third NPN transistor 133 and the eighth resistor terminal 1542 are connected to the ground terminal 172.

Based on the above configuration, the present invention discloses a signal modulation device requiring the utilization of the baseband signal source, the first NMOS transistor and the second NMOS transistor in order to form a circuit structure that directly switches between the Gilbert-cell based differential pair using a differential baseband signal.

The signal generated by the local oscillation signal source is injected into the base 1313 of the first NPN transistor 131. The first NPN transistor 131 amplifies the signal and the first inductor 161 prevents high-frequency signals from being transmitted to the second NPN transistor 132. The amplified signal is then sent to the source 1211 of the first NMOS transistor 121 of the differential pair and the source 1221 of the second NMOS transistor 122 of the differential pair. The baseband signal 112 serves to switch between the ON and OFF states of the first NMOS transistor 121 and the second NMOS transistor 122, thereby achieving the switching of the transmission routes of the oscillating signal and forming the high-frequency oscillating modulation signal at the signal output terminal. Besides, the present invention further uses the second inductor 162 and the third NPN transistor 133 to generate the effect of an RF choke and maintain the operating bias voltage of the first NPN transistor 131 in the active region, so as to improve the quality of signal transmission.

On the other hand, in order to provide the first NMOS transistor 121 and the second NMOS transistor 122 with an appropriate operating bias voltage, the signal modulation device 10 of the present invention further includes a first bias voltage unit 181 and a second bias voltage unit 182. In particular, the first bias voltage unit 181 is connected to the gate 1213 of the first NMOS transistor 121 so as to provide the first NMOS transistor 121 with an appropriate bias voltage. Also, the second bias voltage unit 182 is connected to the gate 1223 of the second NMOS transistor 122 so as to provide the second NMOS transistor 122 with an appropriate bias voltage.

The first bias voltage unit 181 further includes a first biased NPN transistor 1811, a second biased NPN transistor 1812, a third biased NPN transistor 1813 and a fifth resistor 1814 having a ninth resistor terminal 18141 and a tenth resistor terminal 18142. Also, the first biased NPN transistor 1811 has an emitter 18111, a collector 18112, and a base 18113. The second biased NPN transistor 1812 has an emitter 18121, a collector 18122 and a base 18123. The third biased NPN transistor 1813 has an emitter 18131, a collector 18132 and a base 18133.

In particular, the collector 18112 and the base 18113 of the first biased NPN transistor 1811 are connected to the gate 1213 of the first NMOS transistor 121. The collector 18122 and the base 18123 of the second biased NPN transistor 1812 are connected to the emitter 18111 of the first biased NPN transistor 1811. The collector 18132 and the base 18133 of the third biased NPN transistor 1813 are connected to the emitter 18121 of the second biased NPN transistor 1812. The emitter 18131 of the third biased NPN transistor 1813 is connected to the ground terminal 172. The ninth resistor terminal 18141 is connected to the collector 18112 of the first biased NPN transistor 1811. The tenth resistor terminal 18142 is connected to the power source 171.

The second bias voltage unit 182 further includes a fourth biased NPN transistor 1821, a fifth biased NPN transistor 1822, a sixth biased NPN transistor 1823 and a sixth resistor 1824 having a eleventh resistor terminal 18241 and a twelfth resistor terminal 18242. Also, the fourth biased NPN transistor 1821 has an emitter 18211, a collector 18212, and a base 18213. The fifth biased NPN transistor 1822 has an emitter 18221, a collector 18222 and a base 18223. The sixth biased NPN transistor 1823 has an emitter 18231, a collector 18232 and a base 18233.

In particular, the collector 18212 and the base 18213 of the fourth biased NPN transistor 1821 are connected to the gate 1223 of the second NMOS transistor 122. The collector 18222 and the base 18223 of the fifth biased NPN transistor 1822 are connected to the emitter 18211 of the fourth biased NPN transistor 1821. The collector 18232 and the base 18233 of the sixth biased NPN transistor 1823 are connected to the emitter 18221 of the fifth biased NPN transistor 1822. The emitter 18231 of the sixth biased NPN transistor 1823 is connected to the ground terminal 172. The eleventh resistor terminal 18241 is connected to the collector 18212 of the fourth biased NPN transistor 1821. The twelfth resistor terminal 18242 is connected to the power source 171.

Besides, the signal modulation device of the present invention further includes a first capacitor 191, a second capacitor 192, a third capacitor 193, a fourth capacitor 194 and a fifth capacitor 195.

In particular, the first capacitor 191 is connected in series between the gate 1213 of the first NMOS transistor 121 and the baseband signal source 112. The second capacitor 192 is connected in series between the gate 1223 of the second NMOS transistor 122 and the baseband signal source 112. The third capacitor 193 is connected in series between the local oscillation signal source 111 and the base 1313 of the first NPN transistor 131. The fourth capacitor 194 is connected in series between the seventh resistor 1541 and the drain 1212 of the first NMOS transistor 121. The fifth capacitor 195 is connected in series between the back-end circuit 142 and the drain 1222 of the second NMOS transistor 122.

Hence, the aforementioned first bias voltage unit 181 and second bias voltage unit 182 designed into the signal modulation device 10 as disclosed by the present invention provide the first NMOS transistor 121 and the second NMOS transistor 122 with an appropriate operating bias voltage. Appropriate capacitors are placed on the signal transmission routes to allow the signal modulation device 10 to obtain a more stable operating state.

Figure 3:
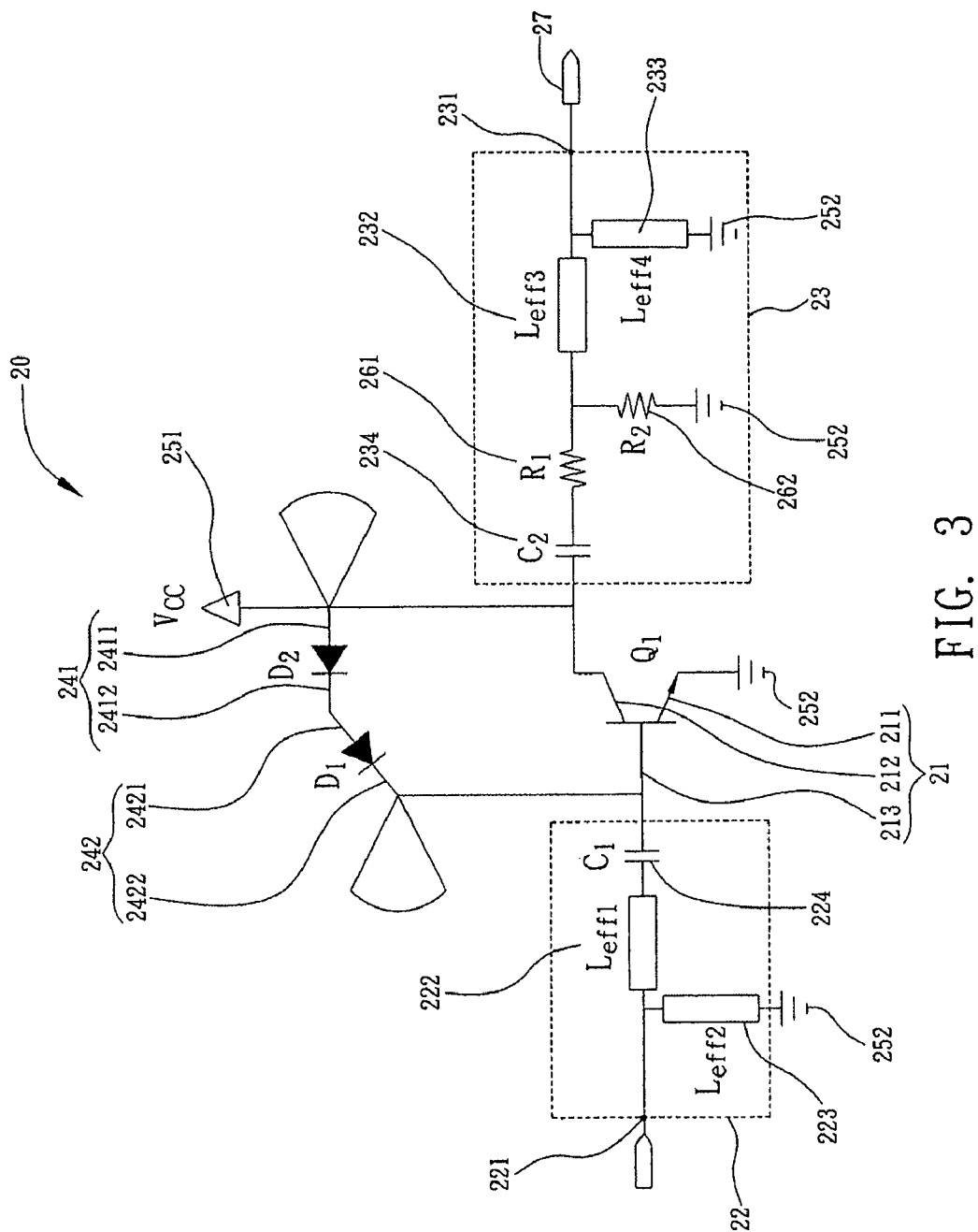
FIG. 3 is a diagram illustrating a signal amplifier of the present invention.

Next, referring to FIG. 3, the diagram illustrates a circuit schematic of a signal amplifier of the present invention. As shown in the diagram, a signal amplifier 20 disclosed by the present invention includes: an NPN transistor 21, a front-end impedance matching network 22, a back-end impedance matching network 23, a first pn-diode 241 and a second pn-diode 242. In particular, the NPN transistor 21 has an emitter 211, a collector 212 and a base 213. The first pn-diode 241 has a p-terminal 2411 and an n-terminal 2412. The second pn-diode 242 has a p-terminal 2421 and an n-terminal 2422. It is noted that a better invention places the signal amplifier 20 in the back-end circuit 142 of the previous embodiment.

In particular, the front-end impedance matching network 22 is connected to a base 213 of the NPN transistor 21. The back-end impedance matching network 23 is connected to a collector 212 of the NPN transistor 21. The n-terminal 2412 of the first pn-diode 241 is connected to the p-terminal 2421 of the second pn-diode 242. The p-terminal 2411 of the first pn-diode 241 is connected to the collector 212 of the NPN transistor 21. The n-terminal 2422 of the second pn-diode 242 is connected to the base 213 of the NPN transistor 21.

Also the front-end impedance matching network 22 has a signal input terminal 221. The back-end impedance matching network 23 has a signal output terminal 231. The front-end impedance matching network 22 further includes a first transmission line 222, a second transmission line 223 and a front-end matching capacitor 224. The back-end impedance matching network 23 further includes a third transmission line 232, a fourth transmission line 233 and a back-end matching capacitor 234.

It is more appropriate in the present invention to form the signal input terminal 221 by connecting one end of the first transmission line 222 to one end of the second transmission line 223, and connect the signal input terminal 221 to the fifth capacitor unit 195 of the previous embodiment to receive the modulation signal sent from the signal modulation device 10 of the present invention. Also, the front-end matching capacitor 224 is connected in series between the other end of the first transmission line 222 and the base 213 of the NPN transistor 21.

The signal output terminal 231 is formed by connecting one end of the third transmission line 232 to one end of the fourth transmission line 233 and the signal output terminal 231 is connected to an antenna unit 27 for wireless RF signal transmission. Also, the back-end matching capacitor 234 is connected in series between the other end of the third transmission line 232 and the collector 212 of the NPN transistor 21.

Also, the signal amplifier further includes a power source 251 and a ground terminal 252. The power source 251 is connected to the p-terminal 2411 of the first pn-diode 241. The emitter 211 of the NPN transistor 21, the other end of the second transmission line 223, and the other end of the fourth transmission line 233 are connected to the ground terminal 252.

Finally, the signal amplifier 20 further includes a first resistor 261 and a second resistor 262. In addition, the first resistor 261 is connected between the back-end matching capacitor 234 and the third transmission line 232, and one end of the second resistor 262 is connected between the first resistor 261 and the third transmission line 232. Also, the other end of the second resistor 262 is connected to the ground terminal 252.

Based on the above arrangement, it has been known that the signal amplifier as disclosed by the present invention receives the signal at the signal input terminal 221. Next, the signal is transmitted to the NPN transistor 21 for signal power amplification via the front-end impedance matching network 22. Lastly the signal is transmitted to the signal output terminal 231 via the back-end impedance matching network 23. The first resistor 261 and the second resistor 262 are connected such that the NPN transistor 21 amplifier operates in an unconditionally stable region to amplify the ASK modulated signal transmitted from the front-end circuit, thereby improving the performance of signal transmission.

While the invention has been particularly shown and described with reference to preferred embodiments for purposes of illustration, it will be understood that variations and modifications can be effected thereto by those skilled in the art without departing from the spirit and scope of the invention as defined by the appended claims.

What is claimed is:

1. A signal modulation device comprising:
   a local oscillation signal source;
   a baseband signal source;
   a first NMOS transistor and a second NMOS transistor, wherein a source of the first NMOS transistor is connected to a source of the second NMOS transistor to form a first connection node, and the baseband signal source is connected in series between a gate of the first NMOS transistor and a gate of the second NMOS transistor; and
   a first NPN transistor having a base and a collector, wherein the base of the first NPN transistor is connected to the local oscillation signal source and the collector of the first NPN transistor is connected to the first connection node.

2. The signal modulation device of claim 1, further comprising a first resistor having a first resistor terminal connected to a drain of the first NMOS transistor and a second resistor terminal, a second resistor having a third resistor terminal connected to a drain of the second NMOS transistor and a fourth resistor terminal, and a power source connected to the second resistor terminal and the fourth resistor terminal.

3. The signal modulation device of claim 2, further comprising a first inductor having a first inductor terminal and a second inductor terminal, a second NPN transistor having a base, an emitter and a collector, and a ground terminal, allowing the first inductor terminal to be connected to the base of the first NPN transistor, the collector and the base of the second NPN transistor to be connected to the second inductor terminal, and the emitter of the second NPN transistor to be connected to the ground terminal.

4. The signal modulation device of claim 3, further comprising a third resistor having a fifth resistor terminal and a sixth resistor terminal, allowing the fifth resistor terminal to be connected to the collector of the second NPN transistor, and the sixth resistor terminal to be connected to the power source.

5. The signal modulation device of claim 3, further comprising a second inductor having a third inductor terminal and a fourth inductor terminal, and a third NPN transistor having a base, a collector and an emitter, allowing the third inductor terminal to be connected to the collector of the first NPN transistor, the collector and the base of the third NPN transistor to be connected to the fourth inductor terminal, and the emitter of the third NPN transistor to be connected to the ground terminal.

6. The signal modulation device of claim 3, further comprising a fourth resistor having a seventh resistor terminal and an eighth resistor terminal, allowing the seventh resistor terminal to be connected to the drain of the first NMOS transistor, and the eighth resistor terminal to be connected to the ground terminal.

7. The signal modulation device of claim 6, further comprising a fourth capacitor connected in series between the seventh resistor terminal and the drain of the first NMOS transistor.

8. The signal modulation device of claim 2, further comprising a signal amplifier connected to the drain of the second NMOS transistor.

9. The signal modulation device of claim 8, further comprising a fifth capacitor connected in series between the signal amplifier and the drain of the second NMOS transistor.

10. The signal modulation device of claim 2, further comprising a first bias voltage unit connected to the gate of the first NMOS transistor, thereby providing the first NMOS transistor with an appropriate bias voltage.

11. The signal modulation device of claim 10, further comprising a second bias voltage unit connected to the gate of the second NMOS transistor, thereby providing the second NMOS transistor with an appropriate bias voltage.

12. The signal modulation device of claim 11, wherein the second bias voltage unit further comprises a biased NPN transistor having a collector and a base, allowing the base of the biased NPN transistor to be connected to the gate of the second NMOS transistor.

13. The signal modulation device of claim 12, wherein the second bias voltage unit further comprises a sixth resistor having an eleventh resistor terminal and a twelfth resistor terminal, allowing the eleventh resistor terminal to be connected to the collector of the biased NPN transistor, and the twelfth resistor terminal to be connected to the power source.

14. The signal modulation device of claim 1, further comprising a first capacitor and a second capacitor, wherein the first capacitor is connected in series between the gate of the first NMOS transistor and the baseband signal source, and the second capacitor is connected in series between the gate of the second NMOS transistor and the baseband signal source.

15. The signal modulation device of claim 1, further comprising a third capacitor connected in series between the local oscillation signal source and the base of the first NPN transistor.

* * * * *